(12) United States Patent
Tung et al.

(10) Patent No.: US 11,462,485 B2
(45) Date of Patent: Oct. 4, 2022

(54) ELECTRONIC PACKAGE INCLUDING ELECTROMAGNETIC SHIELDING STRUCTURE AND METHOD OF MANUFACTURE

(71) Applicant: Orient Semiconductor Electronics, Limited, Kaohsiung (TW)

(72) Inventors: Yueh-Ming Tung, Kaohsiung (TW); Chia-Ming Yang, Kaohsiung (TW); Jung-Wei Chen, Kaohsiung (TW); Ying-Chuan Li, Kaohsiung (TW); Ping-Hua Chu, Kaohsiung (TW)

(73) Assignee: ORIENT SEMICONDUCTOR ELECTRONICS, LIMITED, Kaohsiung (TW)

( * ) Notice: Subject to any disclaimer, the term of this patent is extended or adjusted under 35 U.S.C. 154(b) by 9 days.

(21) Appl. No.: 17/209,784

(22) Filed: Mar. 23, 2021

(65) Prior Publication Data
US 2022/0270981 A1    Aug. 25, 2022

(30) Foreign Application Priority Data
Feb. 23, 2021 (TW) ............................ 110106356

(51) Int. Cl.
| H01L 21/48 | (2006.01) |
| H01L 21/56 | (2006.01) |
| H01L 23/552 | (2006.01) |
| H01L 23/498 | (2006.01) |
| H01L 23/31 | (2006.01) |
| H01L 23/49 | (2006.01) |

(52) U.S. Cl.
CPC ........ *H01L 23/552* (2013.01); *H01L 21/4853* (2013.01); *H01L 21/4889* (2013.01); *H01L 21/565* (2013.01); *H01L 23/3121* (2013.01); *H01L 23/49* (2013.01); *H01L 23/49838* (2013.01)

(58) Field of Classification Search
CPC .............. H01L 23/49838; H01L 23/49; H01L 23/3121; H01L 21/565; H01L 21/4889; H01L 21/4853; H01L 23/552
USPC ........................................ 257/659
See application file for complete search history.

(56) References Cited

U.S. PATENT DOCUMENTS

| 8,071,431 B2 * | 12/2011 | Hoang ................... H01L 24/97 257/E23.114 |
| 2014/0353807 A1 * | 12/2014 | Welch ..................... H01L 21/50 257/659 |
| 2016/0163677 A1 * | 6/2016 | Hu ......................... H01L 25/105 257/774 |

(Continued)

Primary Examiner — Didarul A Mazumder
(74) Attorney, Agent, or Firm — WPAT, PC

(57) ABSTRACT

The present disclosure provides an electronic package. The electronic package includes a substrate, an electronic component, a plurality of conductive elements, a metal sheet and a molding layer. The electronic component is disposed on the substrate and electrically connected to the substrate. The conductive elements are disposed on the substrate and electrically connected with the grounding circuit on the substrate. The metal sheet is disposed above the electronic component and is in electrical contact with the conductive elements. The molding layer is formed between the substrate and the metal sheet to enclose the electronic component and the conductive elements. The present disclosure further provides a method of manufacturing the above electronic package.

11 Claims, 11 Drawing Sheets

(56) References Cited

U.S. PATENT DOCUMENTS

| | | | |
|---|---|---|---|
| 2018/0114783 A1* | 4/2018 | Wang | H01L 23/49811 |
| 2018/0166363 A1* | 6/2018 | Heppner | H01L 21/768 |
| 2019/0051612 A1* | 2/2019 | Kim | H01L 24/10 |
| 2019/0067248 A1* | 2/2019 | Yoo | H01L 24/13 |

* cited by examiner

ELECTRONIC PACKAGE INCLUDING ELECTROMAGNETIC SHIELDING STRUCTURE AND METHOD OF MANUFACTURE

RELATED APPLICATION

The present application is based on and claims priority to Taiwanese Application Number 110106356, filed Feb. 23, 2021, the disclosure of which is hereby incorporated by reference herein in its entirety.

BACKGROUND

1. Technical Field

This disclosure relates to an electronic package and a manufacturing method thereof, and more particularly relates to an electronic package with an electromagnetic shielding structure, and a manufacturing method thereof.

2. Description of the Related Art

The existing methods of forming an electromagnetic shielding structure on an electronic package are mostly to first disposed a plurality of metal pillars arranged in a fence shape around an electronic component, and then form a molding layer with a molding material to cover the electronic component and metal pillars. Afterwards, the top of the molding layer is ground to expose the metal pillars, and then a metal layer is plated on the molding layer to connect with the metal pillars.

The aforementioned method needs to grind off part of the molding layer and plate the metal layer, which not only wastes the molding materials but also increases the manufacturing process.

SUMMARY

In view of the above, the present disclosure provides an electromagnetic package with an electromagnetic shielding structure and a manufacturing method thereof, which does not waste the molding materials and does not increase the manufacturing process.

The electronic package of the present disclosure includes a substrate, an electronic component, a plurality of conductive elements, a metal sheet and a molding layer. The electronic component is disposed on and electrically connecting to the substrate. The conductive elements are disposed on the substrate and electrically connecting with a ground circuit on the substrate. The conductive elements contain a plurality of first conductive elements and a plurality of second conductive elements. The first conductive elements are arranged side by side and around the electronic component. The second conductive elements are arranged side by side and around the first conductive elements. The second conductive elements are arranged to respectively face the gap between two adjacent ones of the first conductive elements. The metal sheet is disposed above the electronic component. The metal sheet is in electrical contact with the first and second conductive elements. The molding layer is formed between the metal sheet and the substrate to cover the electronic component and the first and second conductive elements.

The method of manufacturing an electronic package includes: providing a substrate; disposing an electronic component on the substrate, and electrically connecting the electronic component to the substrate; disposing a plurality of conductive elements on the substrate, and electrically connecting the conductive elements with a ground circuit on the substrate; providing a metal sheet to face the electronic component and the conductive elements; provide a molding material and heating to melt the molding material; making the metal sheet electrically contact the conductive elements; and solidifying the molten molding material to form a molding layer between the metal sheet and the substrate to cover the electronic component and the conductive elements.

In the electronic package of the present disclosure, the electronic component is shielded by the metal sheet, and the conductive elements are used to ground the received electromagnetic signal to the ground terminal of the substrate. Therefore, the electronic package according to the present disclosure may reduce the chance of electromagnetic interference of the electronic component in the package during operation, thereby maintaining the normal operation of the electronic package.

According to the manufacturing method of the electronic package of the present disclosure, there is no need to grind off part of the molding layer and perform additional sputtering or coating processes to form an electromagnetic shielding structure, which may avoid wasting the molding materials and reduce manufacturing processes.

The foregoing, as well as additional objects, features and advantages of the disclosure will be more readily apparent from the following detailed description, which proceeds with reference to the accompanying drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE PREFERRED EMBODIMENT

Figure 1:
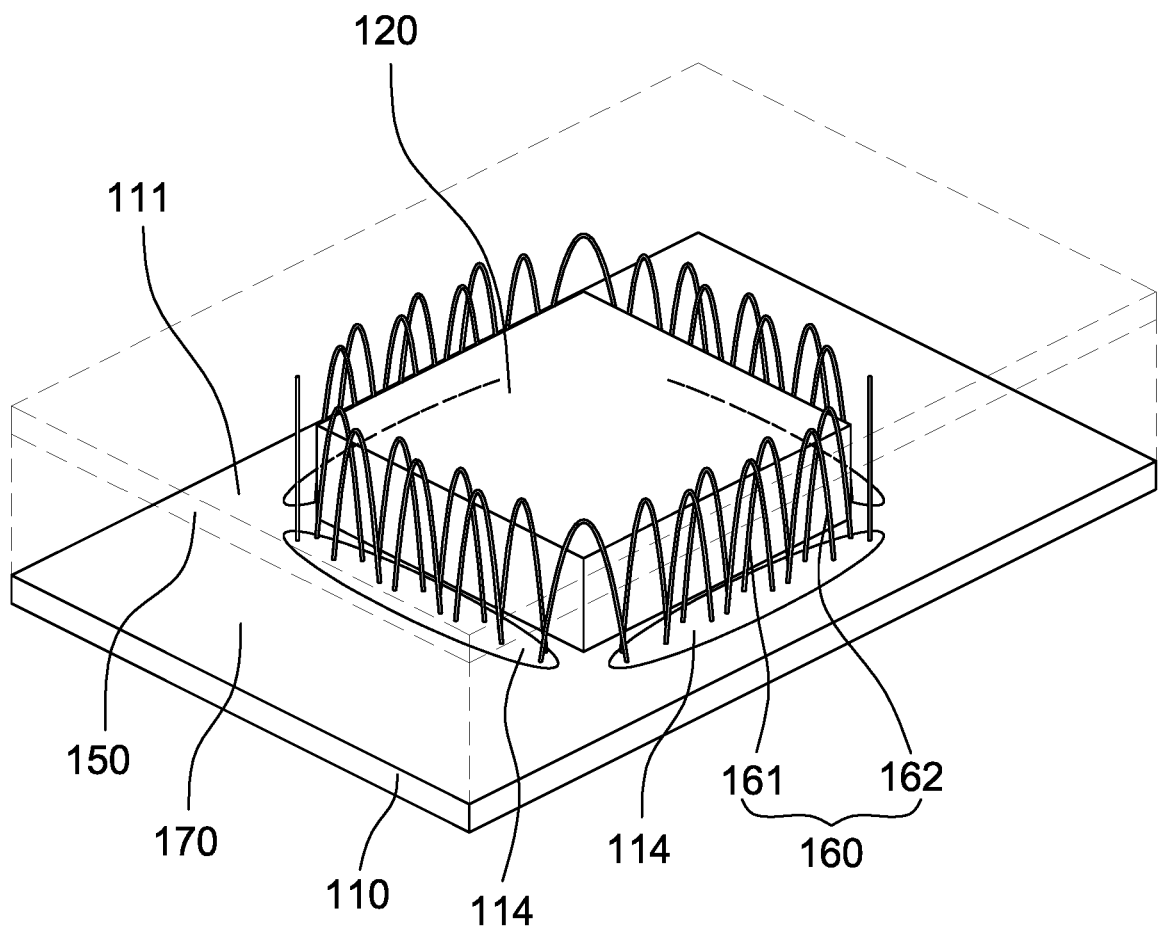
FIG. 1 is a schematic perspective view of the electronic package according to the first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatial relative terms, such as "beneath," "below," "lower," "above," "upper" and the like, may be used herein for ease of description to describe one element or feature's relationship to another element(s) or feature(s) as illustrated in the figures. The spatial relative terms are intended to encompass different orientations of the device in use or operation in addition to the orientation depicted in the figures. The apparatus may be otherwise oriented (rotated 90 degrees or at other orientations) and the spatial relative descriptors used herein may likewise be interpreted accordingly.

Figure 2:
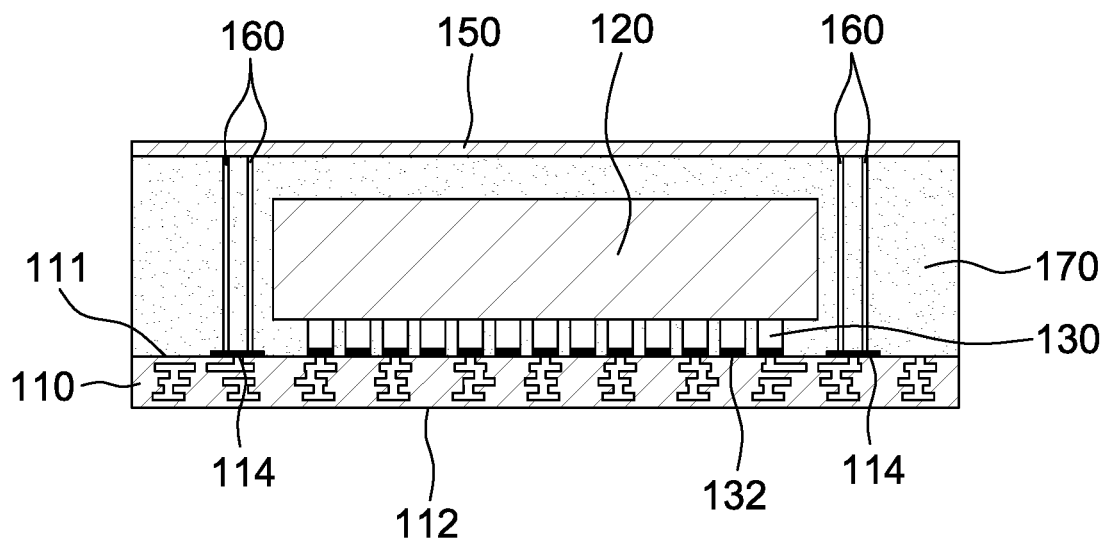
FIG. 2 is a schematic cross-sectional view of the electronic package according to the first embodiment of the present disclosure.
Figure 3:
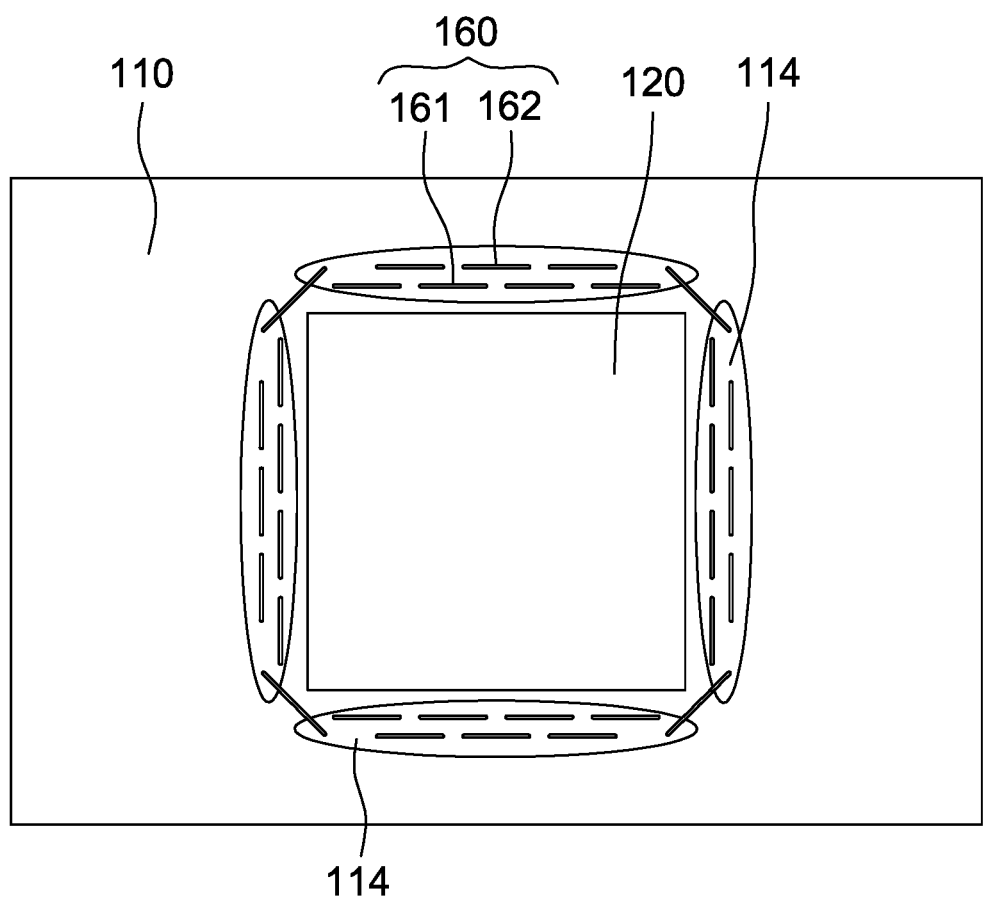
FIG. 3 is another schematic cross-sectional view of the electronic package according to the first embodiment of the present disclosure.

Referring to FIGS. 1 to 3, the electronic package according to the first embodiment of the present disclosure includes a substrate 110 on which a conductive trace layer 114 is provided. The substrate 110 has opposing first surface 111 and second surface 112, and the first surface 111 and the second surface 112 are located on different planes. For example, the first surface 111 is a top surface and the second surface 112 is a bottom surface, but is not limited thereto.

An electronic component 120 is provided on the first surface 111 of the substrate 110 and is electrically connected to the substrate 110. The electronic component 120 may be an active component or a passive component.

In one embodiment, the electronic component 120 may be a die and is electrically connected to the substrate 110 in a flip-chip manner. More specifically, the electronic component 120 has an active surface on which a plurality of conductive pillars 130 is disposed. The conductive pillars 130 are fixed on the first surface 111 of the substrate 110 by solder bumps 132 so that the electronic component 120 is capable of electrically connecting to the substrate 110.

The first surface 111 of the substrate 110 is further provided with a plurality of conductive elements, which are electrically connected to the ground circuit on the substrate 110 through the conductive trace layer 114.

In one embodiment, the conductive elements are bonding wires formed by a wire bonding process. Therefore, the conductive elements are composed of metal wires 160 and present an arch shape. Both ends of the each metal wire 160 are joined to the substrate 110. The each arc-shaped metal wire 160 has a height greater than that of the electronic component 120 and is arranged around the electronic component 120.

In one embodiment, the metal wires 160 are arranged in a fence shape around the electronic component 120.

In another embodiment, the metal wires 160 include a plurality of first metal wires 161 and a plurality of second metal wires 162, and the second metal wires 162 are arranged around the first metal wires 161. Furthermore, two closed loops, including a first loop and a second loop may be defined on the substrate 110. The first loop and the second loop are substantially rectangular, wherein the first loop surrounds the electronic component 120 and the second loop surrounds the first loop and the electronic component 120. The first metal wires 161 are arranged side by side in the shape of the first loop. The second metal wires 162 are arranged side by side in the shape of the second loop, and respectively face the gap between two adjacent ones of the first metal wires 161.

A metal sheet 150 is disposed above the electronic component 120, and the bottom surface of the metal sheet 150 directly contacts the arc-shaped tops of the arc-shaped metal wires 160 so as to make electrical contact with the metal wires 160. A molding layer 170 is formed on the first surface 111 of the substrate 110 and between the metal sheet 150 and the substrate 110 to cover the metal wires 160 and the electronic component 120. The molding layer 170 is formed of a molding material. In one embodiment, the molding material may be epoxy.

According to the electronic package of the present disclosure, the conductive elements may also be formed by other forms of conductive elements. That is, the arc-shaped metal wires 160 in FIGS. 1 to 3 may be replaced by other forms of conductive elements.

Figure 4:
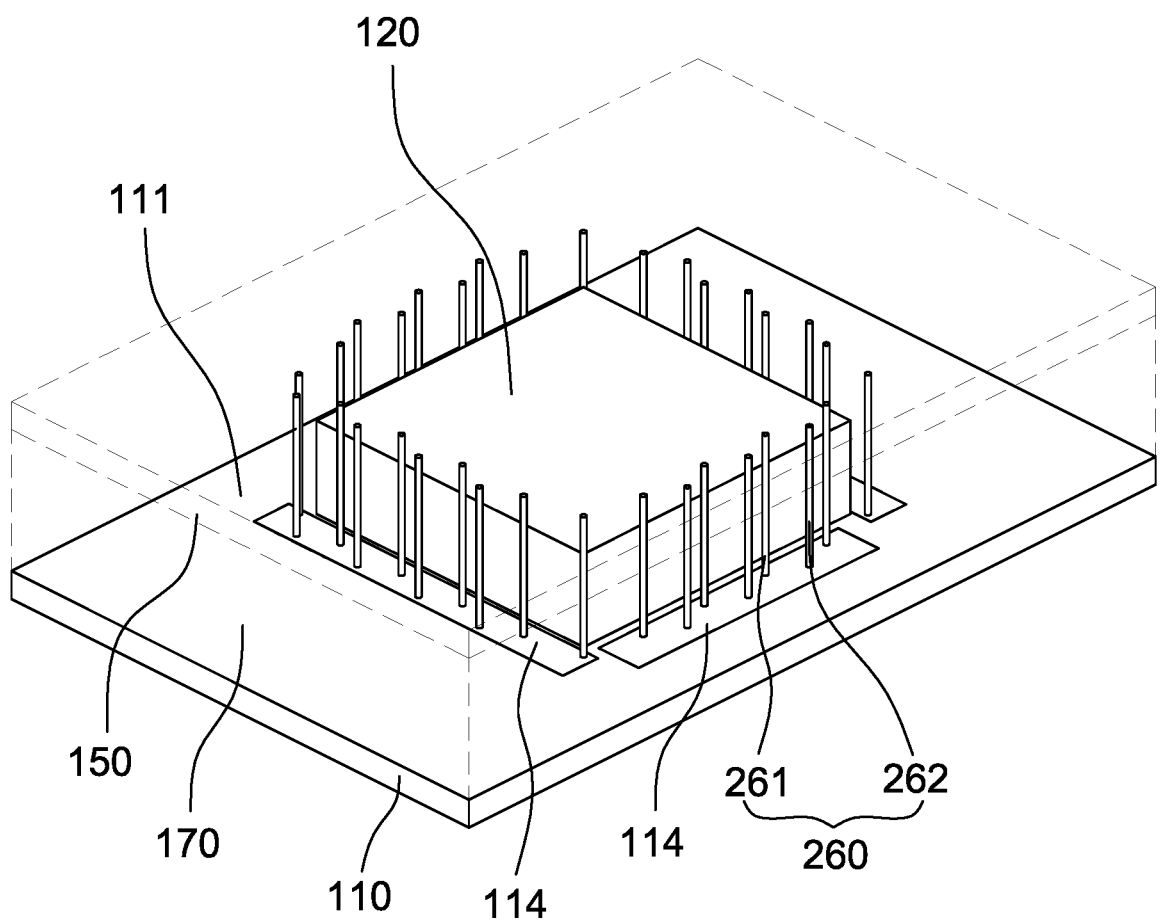
FIG. 4 is a schematic perspective view of the electronic package according to the second embodiment of the present disclosure.
Figure 5:
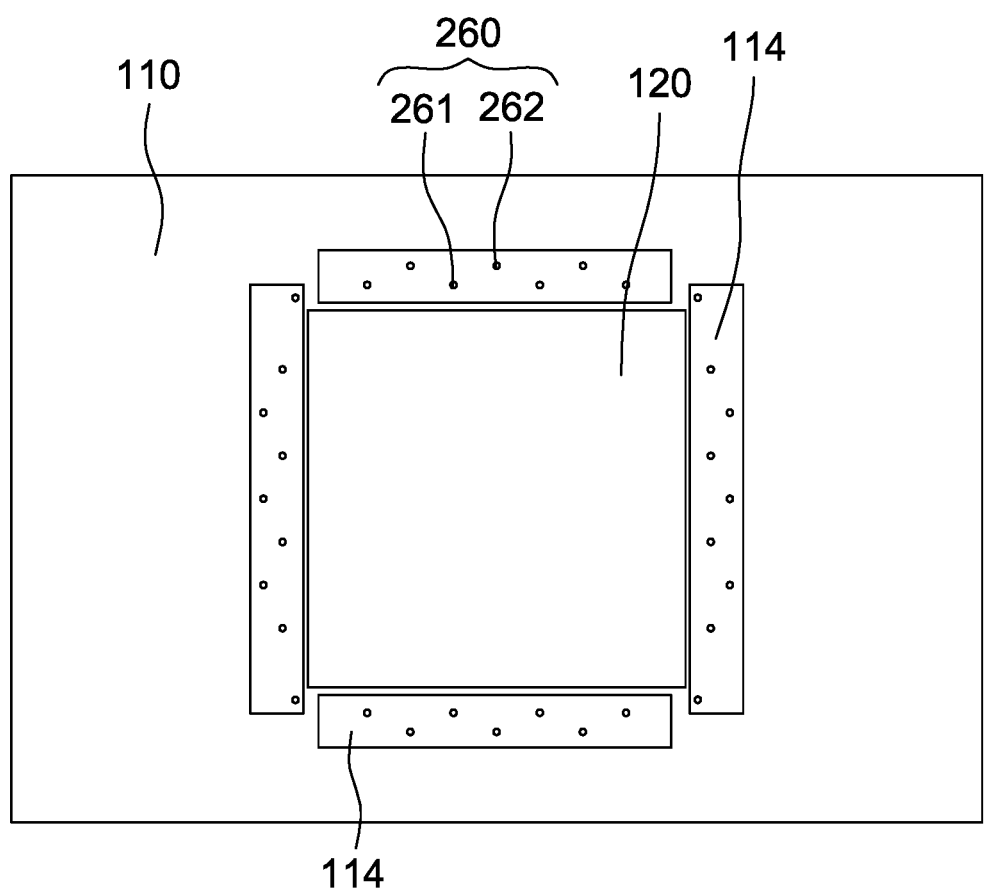
FIG. 5 is a schematic cross-sectional view of the electronic package according to the second embodiment of the present disclosure.

More specifically, the conductive elements may be composed of ones in the form of strips or bumps. FIGS. 4 and 5 are respectively a schematic perspective view and a schematic cross-sectional view of the electronic package according to the second embodiment of the present disclosure. The conductive elements shown in the figures are composed of a plurality of vertical metal wires 260, which are arranged substantially vertically on the substrate 110. The lower ends of the vertical metal wires 260 are bonded to the substrate 110 and are electrically connected to the ground circuit on the substrate 110 through the conductive trace layer 114. The upper ends of the vertical metal wires 260 directly contact the bottom surface of the metal sheet 150 to achieve the purpose of electrical contact with the metal sheet 150. The vertical metal wires 260 include a plurality of first metal wires 261 and a plurality of second metal wires 262, wherein the first metal wires 261 are arranged around the electronic component 120, and the second metal wires 262 are arranged around the electronic component 120 and the first metal wires 261. The first metal wires 261 are disposed side by side and arranged like a ring-shaped fence. The second metal wires 262 are disposed side by side and arranged like a ring-shaped fence, and respectively face the gap between two adjacent ones of the first metal wires 261.

Figure 6:
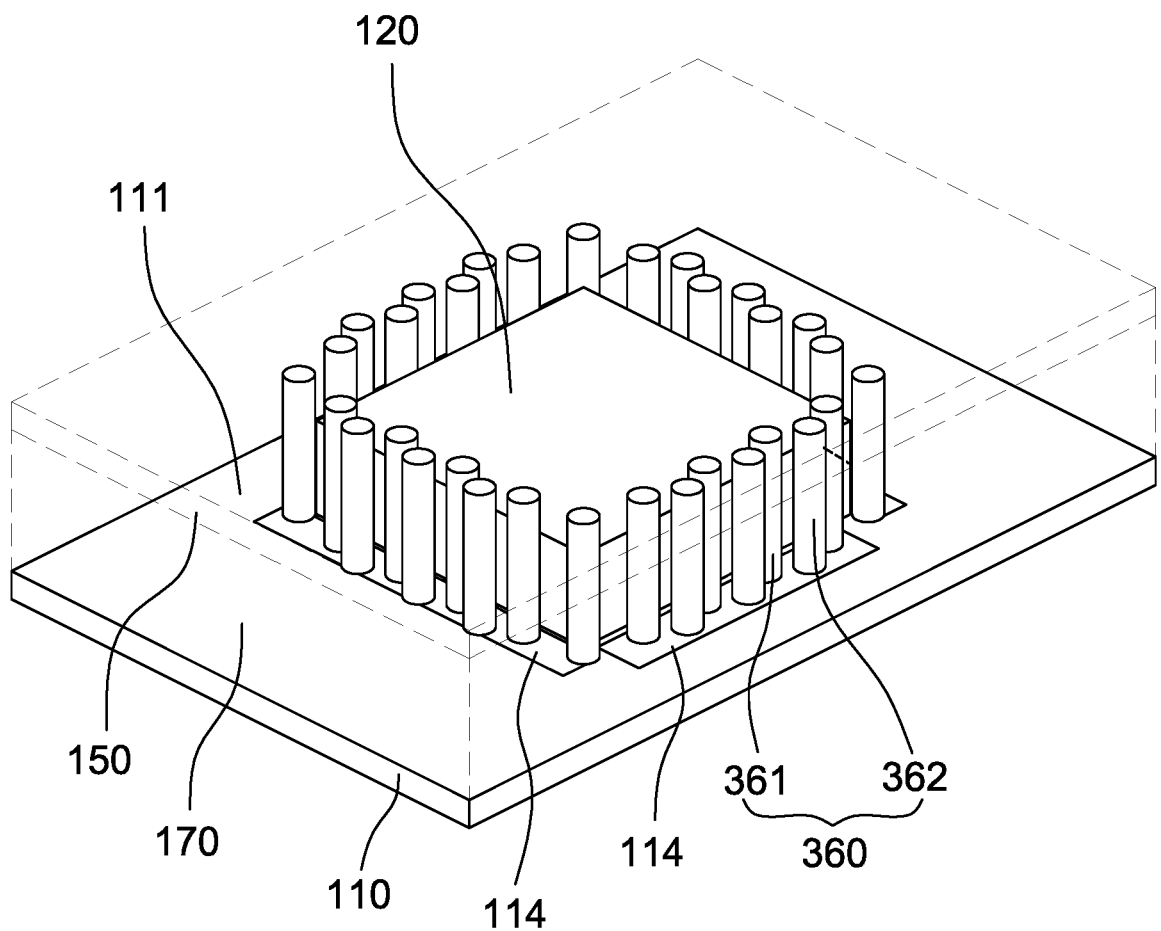
FIG. 6 is a schematic perspective view of the electronic package according to the third embodiment of the present disclosure.
Figure 7:
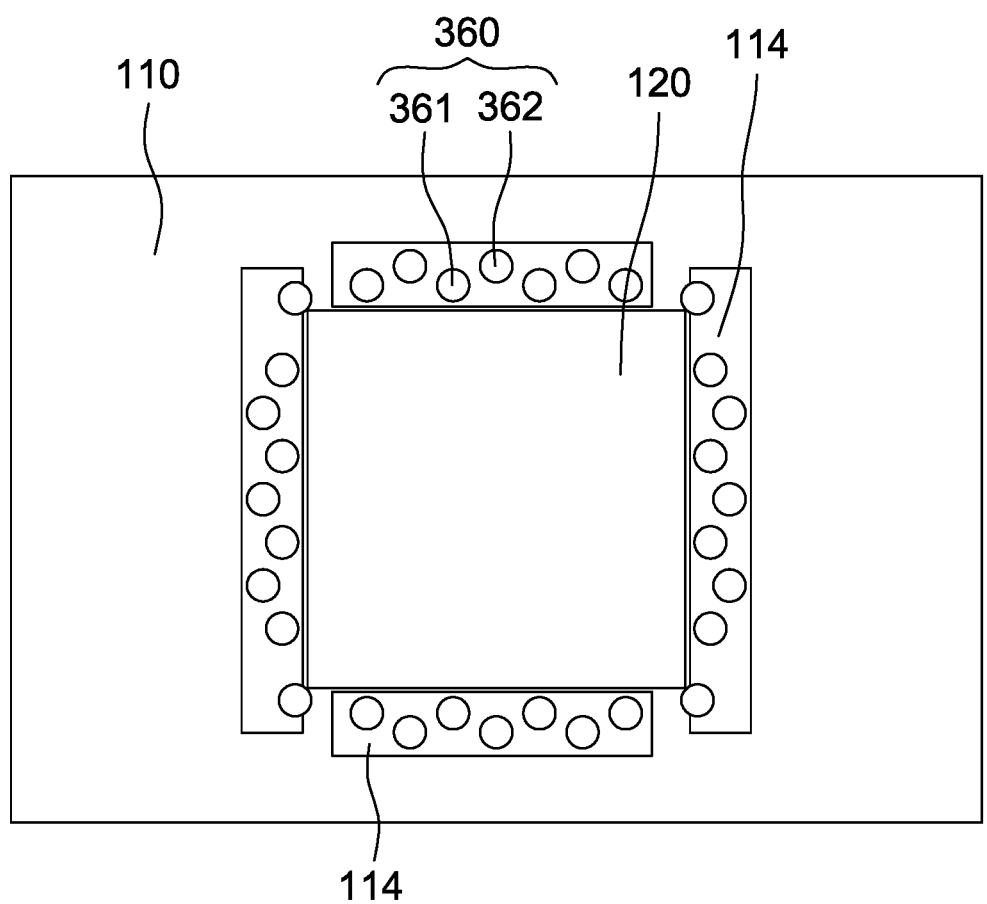
FIG. 7 is a schematic cross-sectional view of the electronic package according to the third embodiment of the present disclosure.

FIGS. 6 and 7 are respectively a schematic perspective view and a schematic cross-sectional view of the electronic package according to the third embodiment of the present disclosure. The conductive elements shown in the figures are composed of a plurality of columnar conductive pillars 360, which are arranged substantially vertically on the substrate 110. The lower ends of the conductive pillars 360 are bonded to the substrate 110 and are electrically connected to the ground circuit on the substrate 110 through the conductive trace layer 114. The upper ends of the conductive pillars 360 directly contact the bottom surface of the metal sheet 150 to achieve the purpose of electrical contact with the metal sheet 150. The conductive pillars 360 include a plurality of first conductive pillars 361 and a plurality of second conductive pillars 362, wherein the first conductive pillars 361 are arranged around the electronic component 120, and the second conductive pillars 362 are arranged around the electronic component 120 and the first conductive pillars 361. The first conductive pillars 361 are disposed side by side and arranged like a ring-shaped fence. The second conductive pillars 362 are disposed side by side and arranged like a ring-shaped fence, and respectively face the gap between two adjacent ones of the first conductive pillars 361.

Figure 8:
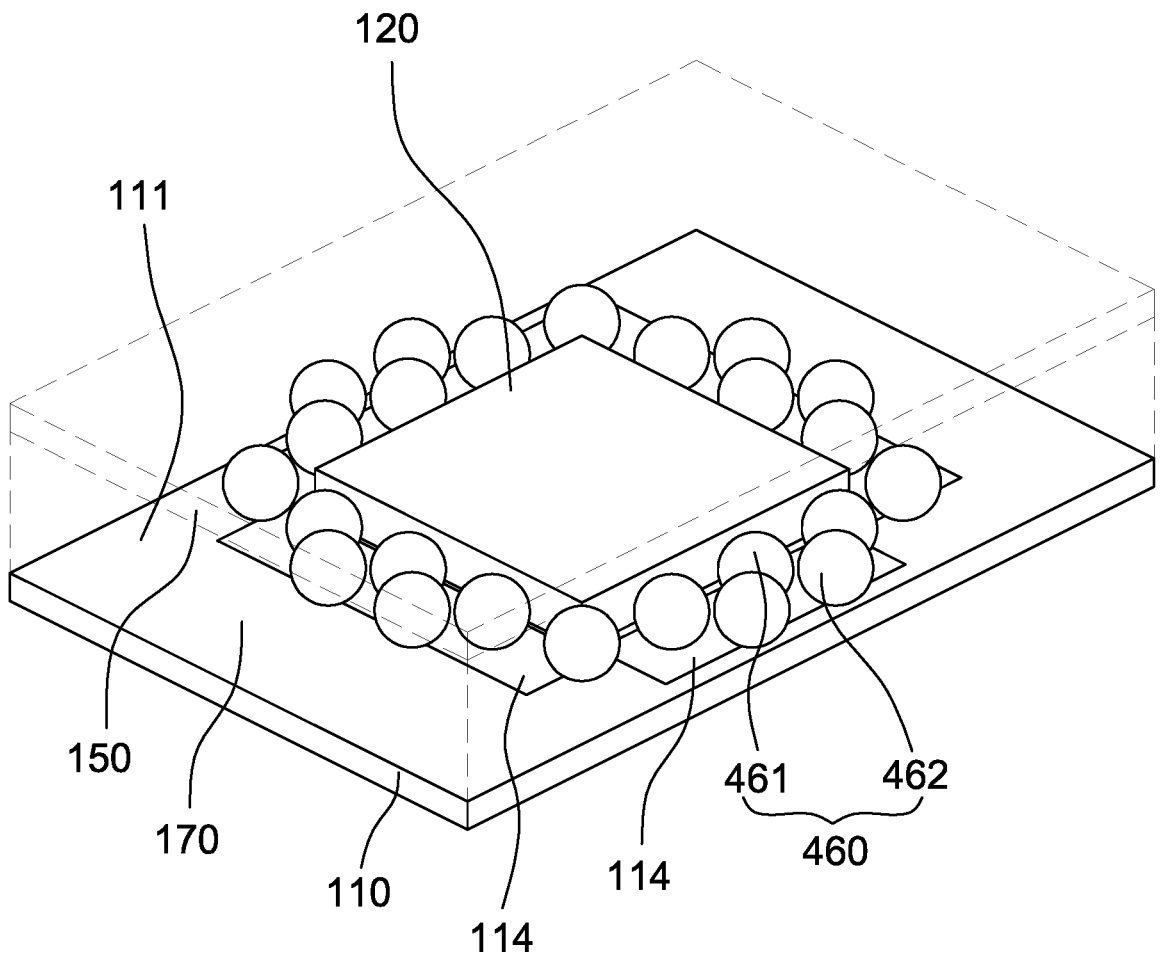
FIG. 8 is a schematic perspective view of the electronic package according to the fourth embodiment of the present disclosure.
Figure 9:
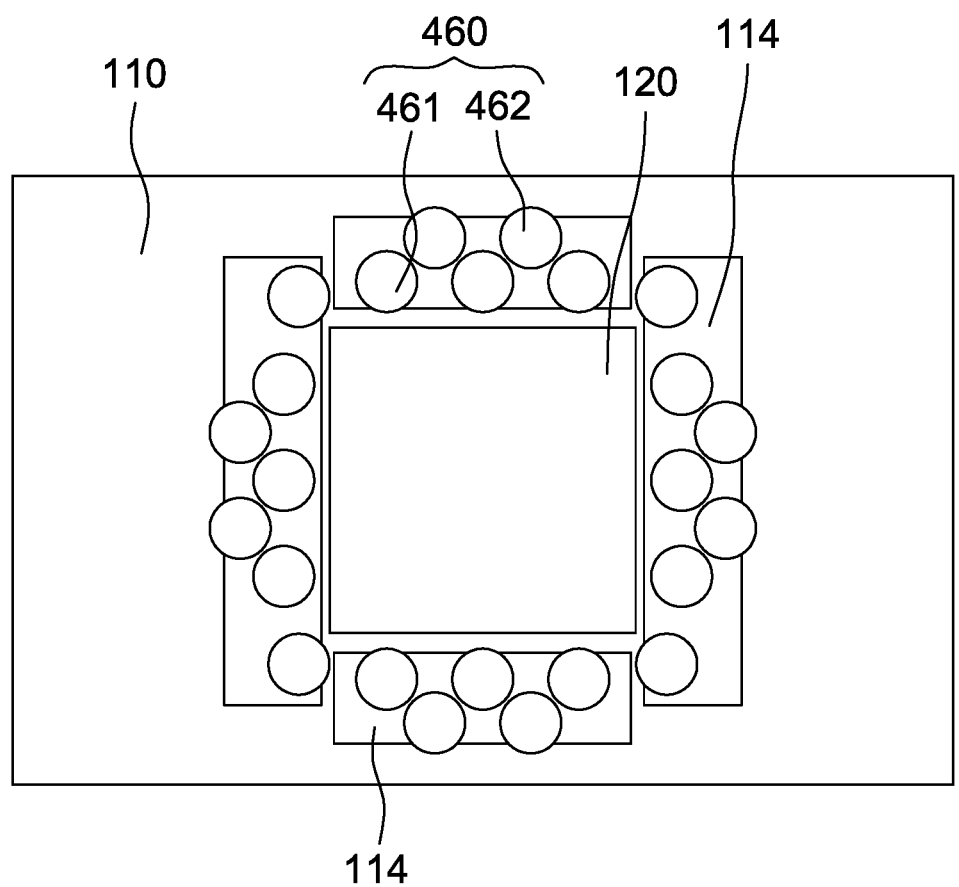
FIG. 9 is a schematic cross-sectional view of the electronic package according to the fourth embodiment of the present disclosure.

FIGS. 8 and 9 are respectively a schematic perspective view and a schematic cross-sectional view of the electronic package according to the fourth embodiment of the present disclosure. The conductive element shown in the figures are composed of a plurality of hemispherical conductive bumps 460. The bottoms of the conductive bumps 460 are bonded to the substrate 110 and are electrically connected to the ground circuit on the substrate 110 through the conductive trace layer 114. The tops of the conductive bumps 460 directly contact the bottom surface of the metal sheet 150 to achieve the purpose of electrical contact with the metal sheet 150. The conductive bumps 460 include a plurality of first conductive bumps 461 and a plurality of second conductive bumps 462, wherein the first conductive bumps 461 are arranged around the electronic component 120, and the second conductive bumps 462 are arranged around the electronic component 120 and the first conductive bumps 461. The first conductive bumps 461 are disposed side by side and arranged like a ring-shaped fence. The second conductive bumps 462 are disposed side by side and arranged like a ring-shaped fence, and respectively face the gap between two adjacent ones of the first conductive bumps 461.

FIGS. 10 to 15 illustrate the method of manufacturing the electronic package of FIG. 1.

Figure 10:
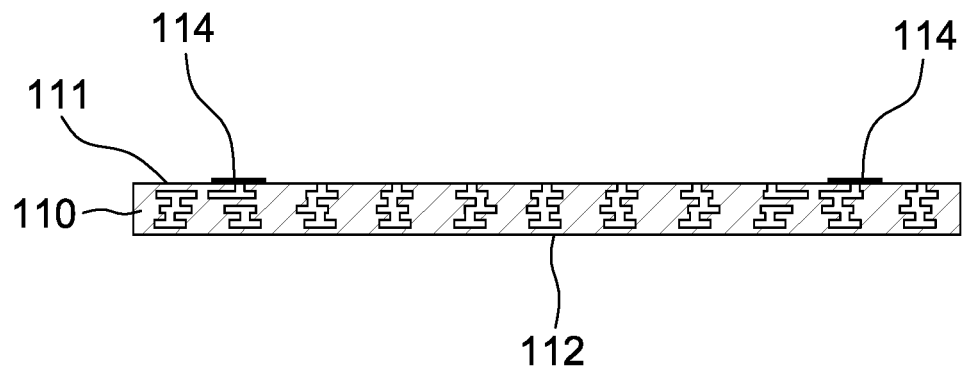
FIGS. 10 to 15 illustrate the method of manufacturing the electronic package of FIG. 1.

As shown in FIG. 10, a substrate 110 is provided. The substrate 110 has opposing first surface 111 and second surface 112, and the first surface 111 and the second surface 112 are located on different planes. A conductive trace layer 114 is arranged on the substrate 110.

Figure 11:
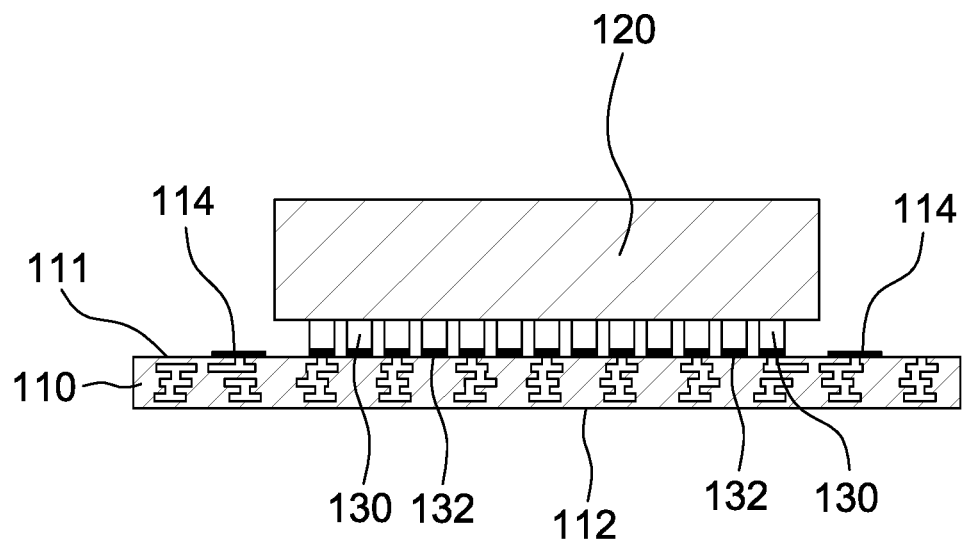

Next, an electronic component 120 is disposed on the first surface 111 of the substrate 110 and electrically connected to the substrate 110, as shown in FIG. 11.

The electronic component 120 may be an active component or a passive component. In one embodiment, the electronic component 120 may be a die and is electrically connected to the substrate 110 in a flip-chip manner. More specifically, the electronic component 120 has an active surface on which a plurality of conductive pillars 130 is disposed. The conductive pillars 130 are fixed on the first surface 111 of the substrate 110 by solder bumps 132 so that the electronic component 120 is capable of electrically connecting to the substrate 110.

Figure 12:
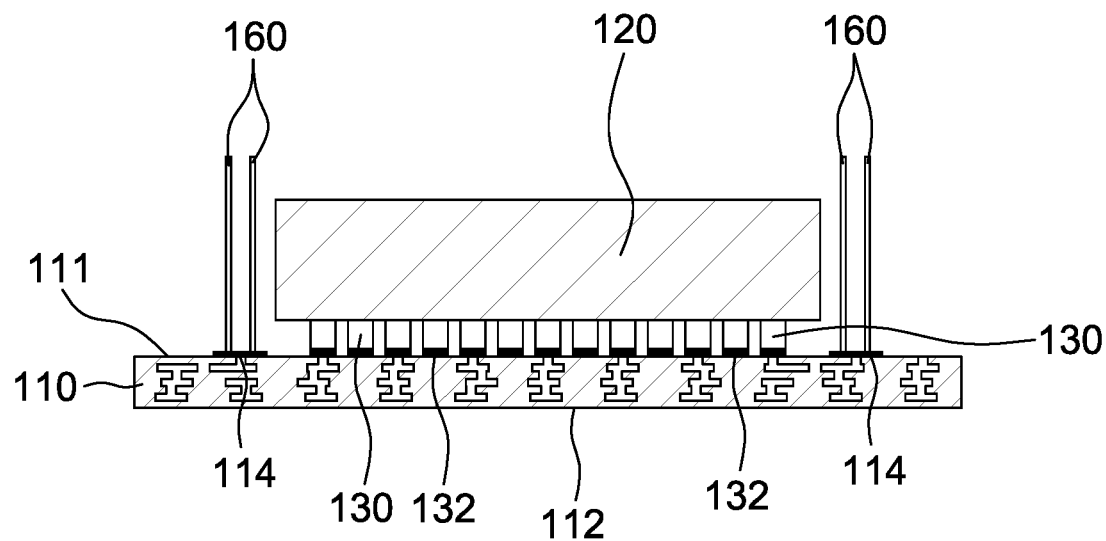

Next, as shown in FIG. 12, a plurality of metal wires 160 as conductive elements is arranged on the first surface 111 of the substrate 110 around the electronic component 120. The metal wires 160 are electrically connected to the ground circuit on the substrate 110 through the conductive trace layer 114. The each metal wire 160 has a height greater than that of the electronic component 120.

In one embodiment, the metal wires 160 are bonding wires formed by a wire bonding process, and two ends of the each metal wire 160 are joined to the substrate 110. The height of the arc-shaped metal wires 160 is greater than that of the electronic component 120.

In another embodiment, the metal wires 160 include a plurality of first metal wires 161 and a plurality of second metal wires 162, and the second metal wires 162 are arranged around the first metal wires 161. The arrangement of the metal wires 160 has been shown in detail in FIGS. 1 and 3, and thus details thereof are not described herein. It should be noted that a part of the metal wires 160 behind the electronic component 120 in FIG. 12 are omitted for simplification purpose.

Figure 13:
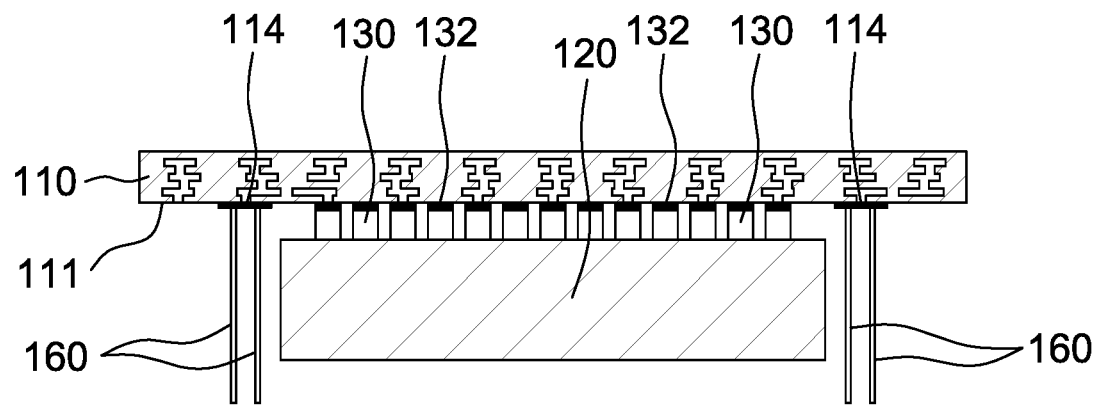
Figure 13:
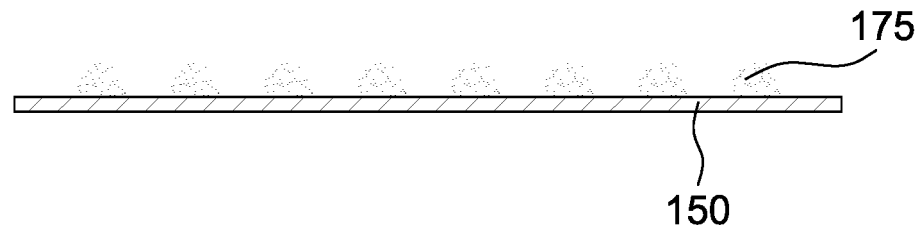

Next, the structure shown in FIG. 12 is turned upside down, and a metal sheet 150 is placed under it so that the metal sheet 150 faces the electronic component 120 and the metal wires 160. Then, a molding material 175 is placed on the metal sheet 150 such that the molding material 175 is located between the metal sheet 150 and the substrate 110, as shown in FIG. 13.

In one embodiment, the molding material 175 may be epoxy. Furthermore, the molding material 175 may be a powder or bulk molding material. The molding material 175 shown in FIG. 13 is a powdered molding material.

Next, the metal sheet 150 is heated to melt the molding material 175 thereon. At this time, the molding material 175 turns into a liquid state and expands in volume, as shown in FIG. 14.

Figure 15:
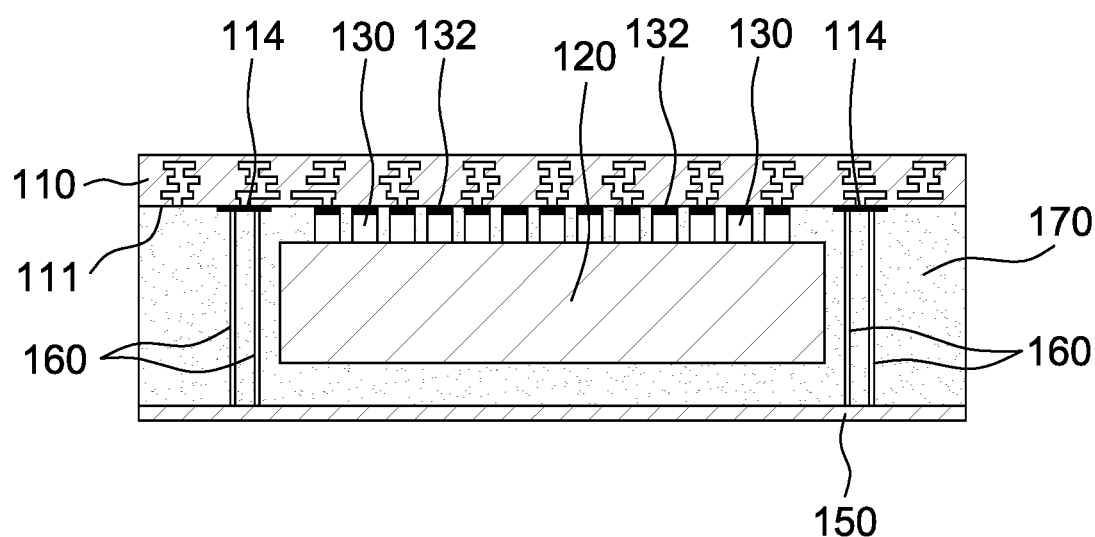

Finally, as shown in FIG. 15, the substrate 110 is approached to the metal sheet 150 so that the metal sheet 150 is in direct contact with the arc-shaped portions of the metal wires 160 to achieve the purpose of electrical contact with the metal wires 160. After the molding material 175 is solidified and cooled to form the molding layer 170 covering the metal wires 160 and the electronic component 120, the electronic package of the present disclosure is completed.

Regarding to the electronic package shown in FIGS. 4-9, the manufacturing method thereof is similar to the manufacturing method of the electronic package shown in FIG. 1. More specifically, the vertical metal wires 260, the conductive pillars 360, or the conductive bumps 460 as a plurality of conductive elements are respectively disposed on the substrate 110 in the manner shown in FIGS. 4 to 9 and are electrically connected to the ground circuit on the substrate 110 through the conductive trace layer 114. The vertical metal wires 260, the conductive pillars 360, or the conductive bumps 460 are arranged around the electronic component 120, and the heights thereof are greater than that of the electronic component 120.

Figure 14:
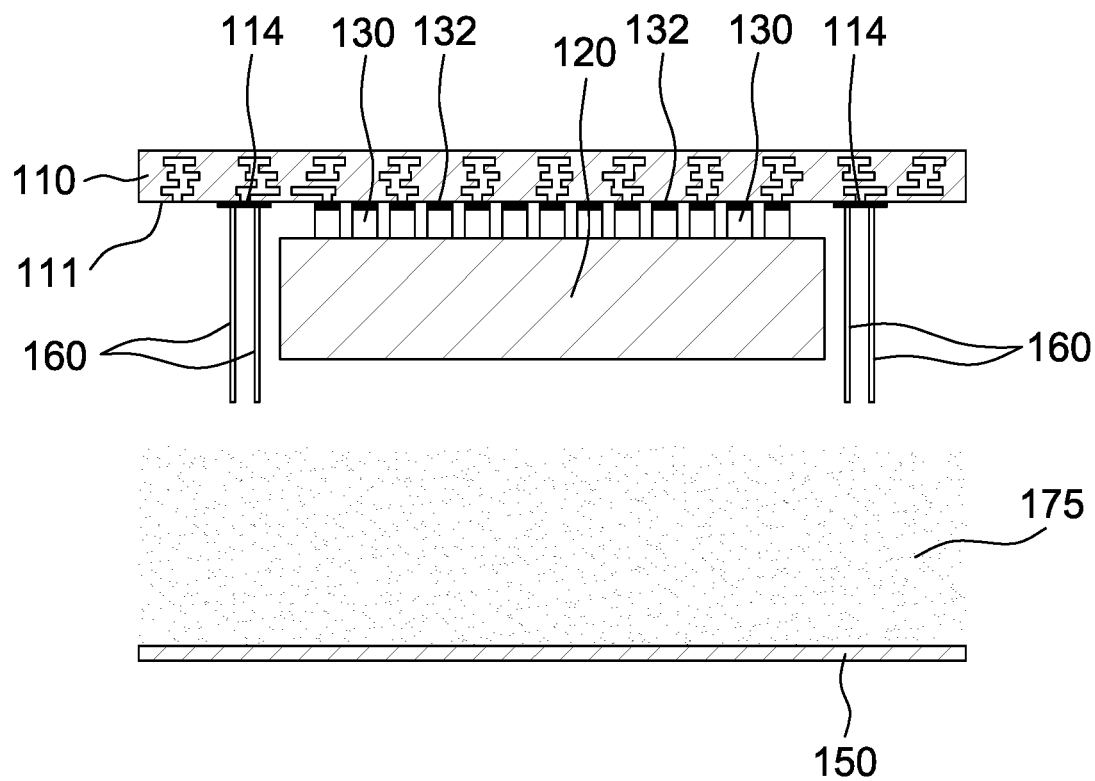

After that, the substrate 110 is placed upside down above the metal sheet 150 and the metal sheet 150 is then heated to melt the molding material 175 thereon according to the manufacturing method shown in FIGS. 13 to 15. When the molding material 175 is melted, the substrate 110 is approached to the metal sheet 150 so that the metal sheet 150 is in direct contact with the vertical metal wires 260, the conductive pillars 360 or the conductive bumps 460. After the molding material 175 is solidified and cooled to form the molding layer 170 covering the electronic component 120 and the vertical metal wires 260, the conductive pillars 360 or the conductive bumps 460, the electronic package shown in FIG. 4-5, 6-7 or 8-9 is completed.

In the electronic package of the present disclosure, the electronic component is shielded by the metal sheet, and the conductive elements are used to ground the received electromagnetic signal to the ground terminal of the substrate. Therefore, the electronic package according to the present disclosure may reduce the chance of electromagnetic interference of the electronic component in the package during operation, thereby maintaining the normal operation of the electronic package.

According to the manufacturing method of the electronic package of the present disclosure, there is no need to grind off part of the molding layer and perform additional sputtering or coating processes to form an electromagnetic shielding structure, which may avoid wasting the molding materials and reduce manufacturing processes.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method of manufacturing an electronic package, comprising:
   providing a substrate;
   disposing an electronic component on the substrate, and electrically connecting the electronic component to the substrate;
   disposing a plurality of conductive elements on the substrate, and electrically connecting the plurality of conductive elements with a ground circuit on the substrate;
   providing a metal sheet to face the electronic component and the plurality of conductive elements;
   providing a molding material on the metal sheet and heating the metal sheet to melt the molding material;
   making the metal sheet electrically contact the plurality of conductive elements; and
   solidifying the molten molding material to form a molding layer between the metal sheet and the substrate to cover the electronic component and the plurality of conductive elements.

2. The method as claimed in claim 1, wherein the plurality of conductive elements is metal wires, the method further comprising:
   bonding both ends of each of the metal wires to the substrate by a wire bonding process.

3. The method as claimed in claim 1, wherein the molding material is epoxy.

4. The method as claimed in claim 1, wherein the molding material is a powdered molding material.

5. The method as claimed in claim 1, wherein the plurality of conductive elements is arranged around the electronic component.

6. The method as claimed in claim 1, wherein the plurality of conductive elements comprises a plurality of first conductive elements and a plurality of second conductive elements, wherein the plurality of first conductive elements being arranged side by side and around the electronic component, the plurality of second conductive elements being arranged side by side and around the plurality of first conductive elements, the plurality of second conductive elements being arranged to respectively face a gap between two adjacent ones of the plurality of first conductive elements.

7. The method as claimed in claim 1, wherein the plurality of conductive elements is selected from a group consisting of vertical metal wires, conductive pillars and conductive bumps.

8. An electronic package, comprising:
   a substrate;
   an electronic component disposed on and electrically connecting to the substrate;
   a plurality of conductive elements disposed on the substrate, wherein the plurality of conductive elements being electrically connecting with a ground circuit on the substrate, the plurality of conductive elements comprising a plurality of first conductive elements and a plurality of second conductive elements, the plurality of first conductive elements being arranged side by side and around the electronic component, the plurality of second conductive elements being arranged side by side and around the plurality of first conductive elements, the plurality of second conductive elements being arranged to respectively face a gap between two adjacent ones of the plurality of first conductive elements;
   a metal sheet disposed above the electronic component, wherein the metal sheet being in electrical contact with the pluralities of first and second conductive elements; and
   a molding layer formed between the metal sheet and the substrate to cover the electronic component and the pluralities of first and second conductive elements.

9. The electronic package as claimed in claim 8, wherein the pluralities of first and second conductive elements are metal wires and both ends of each of the metal wires are bonded to the substrate.

10. The electronic package as claimed in claim 9, wherein the metal wires are arc-shaped metal wires, and wherein the metal sheet being in direct contact with arc-shaped portions of the metal wires.

11. The electronic package as claimed in claim 8, wherein the pluralities of first and second conductive elements are selected from a group consisting of vertical metal wires, conductive pillars and conductive bumps.

* * * * *